(12) United States Patent
Sakamoto

(10) Patent No.: US 7,347,725 B2
(45) Date of Patent: Mar. 25, 2008

(54) METAL FIXING MEMBER FOR FIXING A CONNECTOR TO A WIRING BOARD

(75) Inventor: Nobuyuki Sakamoto, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/313,692

(22) Filed: Dec. 22, 2005

(65) Prior Publication Data

US 2006/0141859 A1 Jun. 29, 2006

(30) Foreign Application Priority Data

Dec. 27, 2004 (JP) .............................. P2004-377016

(51) Int. Cl.
*H01R 13/73* (2006.01)
(52) U.S. Cl. ..................................... 439/566
(58) Field of Classification Search ................ 439/570, 439/83, 571, 572, 567, 573, 566
See application file for complete search history.

(56) References Cited

U.S. PATENT DOCUMENTS

| | | | | |
|---|---|---|---|---|
| 5,120,256 | A | * | 6/1992 | Walden ........................ 439/553 |
| 5,241,451 | A | * | 8/1993 | Walburn et al. ............. 361/785 |
| 5,257,948 | A | * | 11/1993 | Peterson ....................... 439/571 |
| 5,334,049 | A | * | 8/1994 | Kachlic et al. .............. 439/567 |
| 5,551,891 | A | * | 9/1996 | Huss, Jr. ....................... 439/567 |
| 5,622,519 | A | * | 4/1997 | Bixler et al. ................. 439/570 |
| 5,961,347 | A | * | 10/1999 | Hsu ............................. 439/570 |
| 6,012,780 | A | * | 1/2000 | Duvernay ....................... 303/7 |
| 6,012,949 | A | | 1/2000 | Lok |
| 6,022,243 | A | * | 2/2000 | Yang et al. .................. 439/567 |
| 6,022,244 | A | | 2/2000 | Chiu |
| 6,159,043 | A | * | 12/2000 | Yao et al. .................... 439/567 |
| 6,454,575 | B1 | * | 9/2002 | Jones et al. .................... 439/79 |
| 6,454,599 | B1 | * | 9/2002 | Wu ............................. 439/567 |
| 6,468,108 | B1 | * | 10/2002 | Wu ............................. 439/567 |
| 6,923,679 | B1 | * | 8/2005 | Wu ............................. 439/573 |
| 7,001,212 | B1 | * | 2/2006 | Juntwait ....................... 439/566 |
| 7,048,576 | B2 | * | 5/2006 | Nakano ....................... 439/570 |
| 2002/0168893 | A1 | * | 11/2002 | Kasahara ..................... 439/573 |
| 2005/0106937 | A1 | * | 5/2005 | Lin ............................. 439/567 |
| 2006/0178037 | A1 | * | 8/2006 | Ngo ............................. 439/469 |

FOREIGN PATENT DOCUMENTS

DE 102 43 407 A1 4/2004

(Continued)

*Primary Examiner*—Chandrika Prasad
(74) *Attorney, Agent, or Firm*—Sughrue Mion, PLLC

(57) ABSTRACT

A metal fixing member for fixing a connector to a wiring board, includes a board fixing portion that is adapted to be secured to the wiring board, a housing mounting portion that is disposed in upstanding relation to the board fixing portion, and is adapted to be mounted on the connector, and an interconnecting portion that is bended and that interconnects the board fixing portion and the housing mounting portion. The board fixing portion includes a first fixing portion and a second fixing portion that are arranged in symmetrical relation with respect to the interconnecting portion. The first fixing portion extends in a first direction along a thickness direction of the housing mounting portion. The second fixing portion extends in a second direction opposed to the first direction. The metal fixing member is formed entirely of a single metal sheet.

12 Claims, 7 Drawing Sheets

FOREIGN PATENT DOCUMENTS

| | | |
|---|---|---|
| JP | 5-21116 A | 1/1993 |
| JP | 5-48275 U | 6/1993 |
| JP | 6-20746 A | 1/1994 |
| JP | 6-84680 U | 12/1994 |
| JP | 7-220780 A | 8/1995 |
| JP | 8-130055 A | 5/1996 |
| JP | 9-161912 A | 6/1997 |
| JP | 10-64608 A | 3/1998 |
| JP | 10-172649 A | 6/1998 |

* cited by examiner

METAL FIXING MEMBER FOR FIXING A CONNECTOR TO A WIRING BOARD

BACKGROUND OF THE INVENTION

This invention relates to a metal fixing member for fixing a connector to a wiring board and also to a connector provided with the metal fixing members.

One known related metal fixing member for fixing a connector to a wiring board is formed by bending a strip-like metal sheet into a generally cross-sectionally L-shape, and one metal piece portion, extending from a generally-central bent portion in a longitudinal direction, is affixed to an outer surface of a connector housing, while the other metal piece portion is fixedly secured to the wiring board by soldering or the like, thereby fixing the connector to the wiring board (see, for example, JP-A-8-130055 (Pages 3 to 4, FIG. 1) and JP-A-9-161912 (Pages 2 to 4, FIG. 1)).

FIG. 9 shows a metal fixing member which is substantially identical in structure to those disclosed in JP-A-8-130055 and JP-A-9-161912.

As shown in FIG. 9, the metal fixing member 1 includes a board fixing portion 3 for being fixed to a board surface of a wiring board, and a housing mounting portion 2 which is disposed in upstanding relation to the board fixing portion 3, and is adapted to be mounted on an outer surface of a connector housing of a connector, and a generally right-angularly-bent interconnecting portion 4 interconnecting the board fixing portion 3 and the housing mounting portion 2. This metal fixing member 1 is formed by bending a metal sheet of a generally rectangular shape into a generally cross-sectionally L-shape.

A method of fixing the connector to the mounting board by the metal fixing members 1 will be described, using FIG. 2 (which is a perspective view of one preferred embodiment of the invention) for convenience' sake. First, the housing mounting portions 2 of the pair of metal fixing members 1 are mounted respectively on fixture mounting portions 41a formed respectively on opposite end surfaces of the connector housing 41. Then, the board fixing portions 3 of the two metal fixing members 1 are soldered respectively to lands 45 (each made of a metallic foil) formed on the wiring board 43. Thus, the connector housing 41 is fixed to the wiring board 43 by the pair of metal fixing members 1.

When an external force, tending to separate the connector from the wiring board 43 in a direction of arrow A (in FIG. 9), is applied to the connector, this external force acts on solder 47, interposed between the board fixing portion 3 and the land 45 on the wiring board 43, via the housing mounting portion 2 and the interconnecting portion 4 of the metal fixing member 1, and tends to separate or tear the board fixing portion 3 from the wiring board 43. At this time, stresses concentrate particularly on solder 47a interposed between that region of the board fixing portion 3, disposed adjacent to the interconnecting portion 4, and the land 45. Therefore, when the external force, exceeding the joining strength of the solder, is applied, first, breakage develops in the solder 47a interposed between the region of the board fixing portion 3, disposed adjacent to the interconnecting portion 4, and the land 45 (For example, the solder 47a is separated from the board fixing portion 3).

Then, the breakage of the solder 47, starting from the solder 47a, proceeds sequentially toward a distal end edge of the board fixing portion 3 (in a direction of arrow B in FIG. 9), since the metal fixing member 1 has the generally L-shaped cross-section such that the board fixing portion 3 extends from one side edge of the interconnecting portion 4 in a direction of the thickness of the housing mounting portion 2. Therefore, there has been encountered a problem that the force of fixing of the metal fixing member 1 to the wiring board 43 is not necessarily sufficient.

In order to secure the sufficient fixing force for the metal fixing member 1, it may be proposed to increase the area of the board fixing portion 3 so as to increase the area of joining of the board fixing portion 3 to the land 45 on the wiring board 43, or it may be proposed to increase the width of the board fixing portion 3 so as to reduce the degree of concentration of the stresses on the solder 47a interposed between the region of the board fixing portion 3, disposed adjacent to the interconnecting portion 4, and the land 45. However, there has been encountered a problem that these measures can not meet the requirements of the compact design and space-saving design of the metal fixing member 1.

SUMMARY OF THE INVENTION

This invention has been made in view of the above problems, and an object of the invention is to provide a metal fixing member and a connector with the metal fixing members, in which the compact and space-saving design of the metal fixing member can be achieved, and besides the force of fixing of the metal fixing member to a wiring board is enhanced.

The above object has been achieved by a metal fixing member of the present invention having features recited in the following Paragraphs (1) to (3).

A metal fixing member for fixing a connector to a wiring board is formed entirely of a single metal sheet, and the metal fixing member includes a board fixing portion for being fixedly secured to a board surface of the wiring board, a housing mounting portion which is disposed in upstanding relation to the board fixing portion, and is adapted to be mounted on an outer surface of a connector housing of the connector, and a bent interconnecting portion interconnecting the board fixing portion and the housing mounting portion, and the board fixing portion includes a first fixing portion extending forwardly of the housing mounting portion in a direction of a thickness of the housing mounting portion, and a second fixing portion extending rearwardly of the housing mounting portion in the direction of the thickness thereof, with the interconnecting portion disposed between the first and second fixing portions. In the metal fixing member of the above Paragraph (1), the second fixing portion extends from the first fixing portion rearwardly in the direction of the thickness of the housing mounting portion.

In the metal fixing member of the above Paragraph (1), the interconnecting portion includes bent first and second interconnecting portions, and the first fixing portion is connected to the housing mounting portion via the bent first interconnecting portion, and the second fixing portion is connected to the housing mounting portion via the second interconnecting portion which is bent in symmetrical relation to the first interconnecting portion.

In the metal fixing member of the above construction, the board fixing portion includes the first fixing portion extending forwardly of the housing mounting portion in the direction of the thickness thereof, and the second fixing portion extending rearwardly of the housing mounting portion in the direction of the thickness thereof, with the interconnecting portion disposed between the first and second fixing portions. Therefore, even when an external force, tending to separate or tear the board fixing portion from the wiring board, acts on the board fixing portion via the housing mounting portion and the interconnecting portion of the metal fixing member, this external force is borne or supported in a distributed manner by the first and second fixing portions extending respectively forwardly and rearwardly of the housing mounting portion in the direction of the thickness thereof, with the interconnecting portion disposed between the first and second fixing portions. Therefore, the degree of concentration of stresses, developing at that region of the board fixing portion disposed adjacent to the interconnecting portion, is reduced. Even if the fixing of the region of the board fixing portion (disposed adjacent to the interconnecting portion) to the wiring board should be broken or destroyed, this breakage proceeds toward a distal end edge of the first fixing portion and also toward a distal end edge of the second fixing portion (that is, forwardly and rearwardly in the direction of the thickness of the housing mounting portion). Therefore, the breakage, proceeding toward the distal end of the first fixing portion, is suppressed by the second fixing portion, while the breakage, proceeding toward the distal end edges of the second fixing portion, is suppressed by the first fixing portion. Namely, the proceeding of the breakage is suppressed by the mutual actions of the first and second fixing portions. Therefore, the force of fixing of the metal fixing member to the wiring board can be enhanced, and therefore the metal fixing member can be formed into a more compact design as compared with the related metal fixing member, while maintaining the sufficient fixing force, so that the space-saving design can be achieved.

The above object has been achieved by a connector of the invention having a feature recited in the following Paragraph (4).

In the connector, the metal fixing member as defined in any one of the above Paragraphs (1) to (3) is mounted on an outer surface of a connector housing.

The connector of this construction can be firmly fixed to the wiring board by the metal fixing member, and therefore the reliability of electrical connection of the connector to wiring installed on the wiring board can be enhanced. And besides, the metal fixing member has the more compact and space-saving design as compared with the related metal fixing member, and therefore a space on the wiring board can be efficiently used.

According to the present invention, there is also provided a metal fixing member for fixing a connector to a wiring board, comprising:

a board fixing portion that is adapted to be secured to the wiring board;

a housing mounting portion that is disposed in upstanding relation to the board fixing portion, and is adapted to be mounted on the connector; and an interconnecting portion that is bended and that interconnects the board fixing portion and the housing mounting portion, wherein the board fixing portion includes a first fixing portion and a second fixing portion that are arranged in symmetrical relation with respect to the interconnecting portion;

wherein the first fixing portion extends in a first direction along a thickness direction of the housing mounting portion;

wherein the second fixing portion extends in a second direction opposed to the first direction; and wherein the metal fixing member is formed entirely of a single metal sheet.

Preferably, the first fixing portion extends from the interconnecting portion; and wherein the second fixing portion extends from the first fixing portion.

Preferably, the interconnecting portion includes two interconnecting portions. The second fixing portion is arranged between the two interconnecting portions, and is separated from the two interconnecting portions.

Preferably, the second fixing portion includes two second fixing portions. The interconnecting portion is arranged between the two second fixing portions, and is separated from the two second fixing portions.

Preferably, the interconnecting portion includes a first interconnecting portion and a second interconnecting portion that is bent in symmetrical relation to the first interconnecting portion. The first fixing portion is connected to the housing mounting portion through the first interconnecting portion. The second fixing portion is connected to the housing mounting portion through the second interconnecting portion.

In the present invention, there can be provided the metal fixing member which has the compact and space-saving design, and can be fixed to the wiring board with the increased fixing force, and also there can be provided the connector provided with the metal fixing member.

The invention has been briefly described above. Details of the invention will become manifest upon reading the following Section "Best Mode for Carrying Out the Invention" with reference to the accompanying drawings.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Preferred embodiments of the present invention will now be described in detail with reference to the drawings.

First Embodiment

Figure 1:
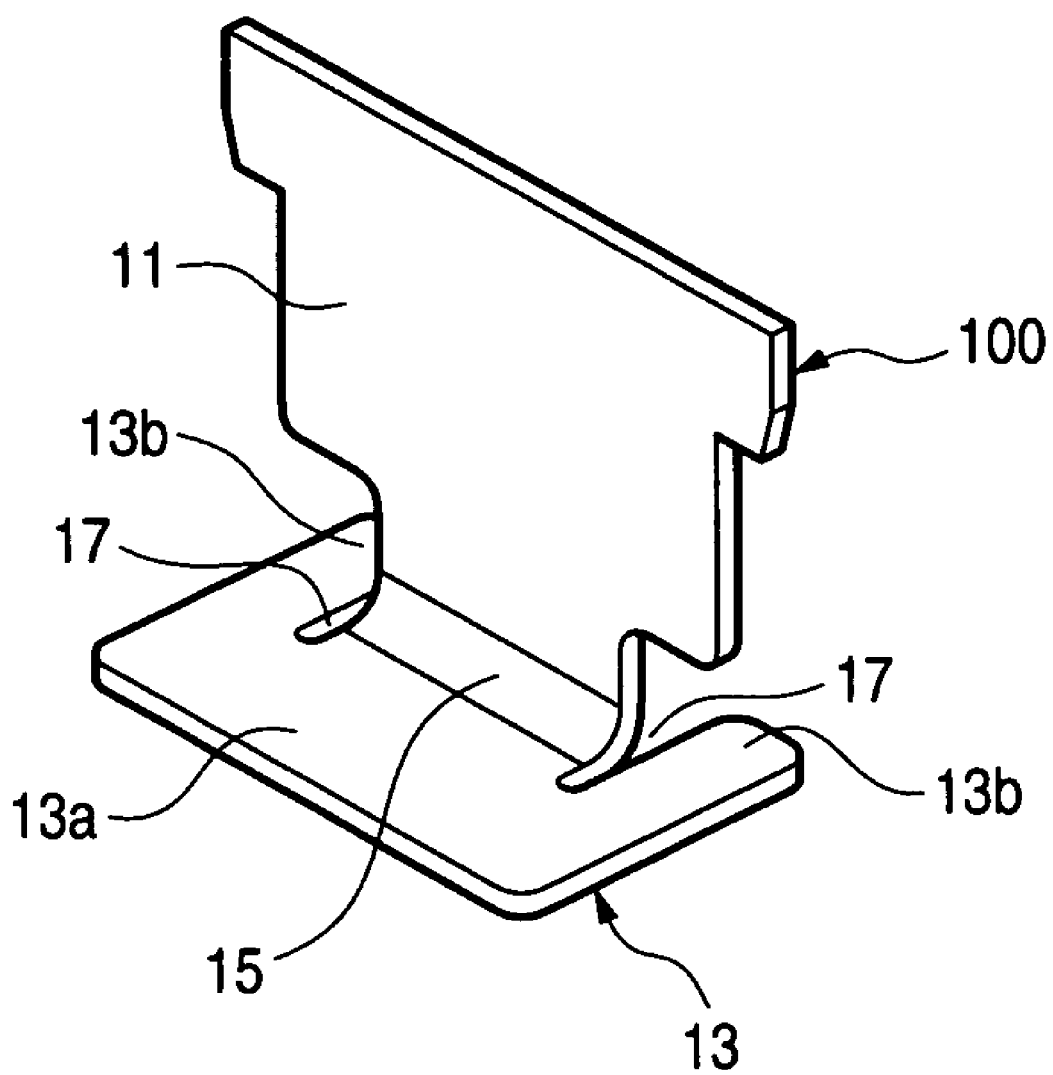
FIG. 1 is a perspective view of a first embodiment of a metal fixing member of the present invention.
Figure 2:
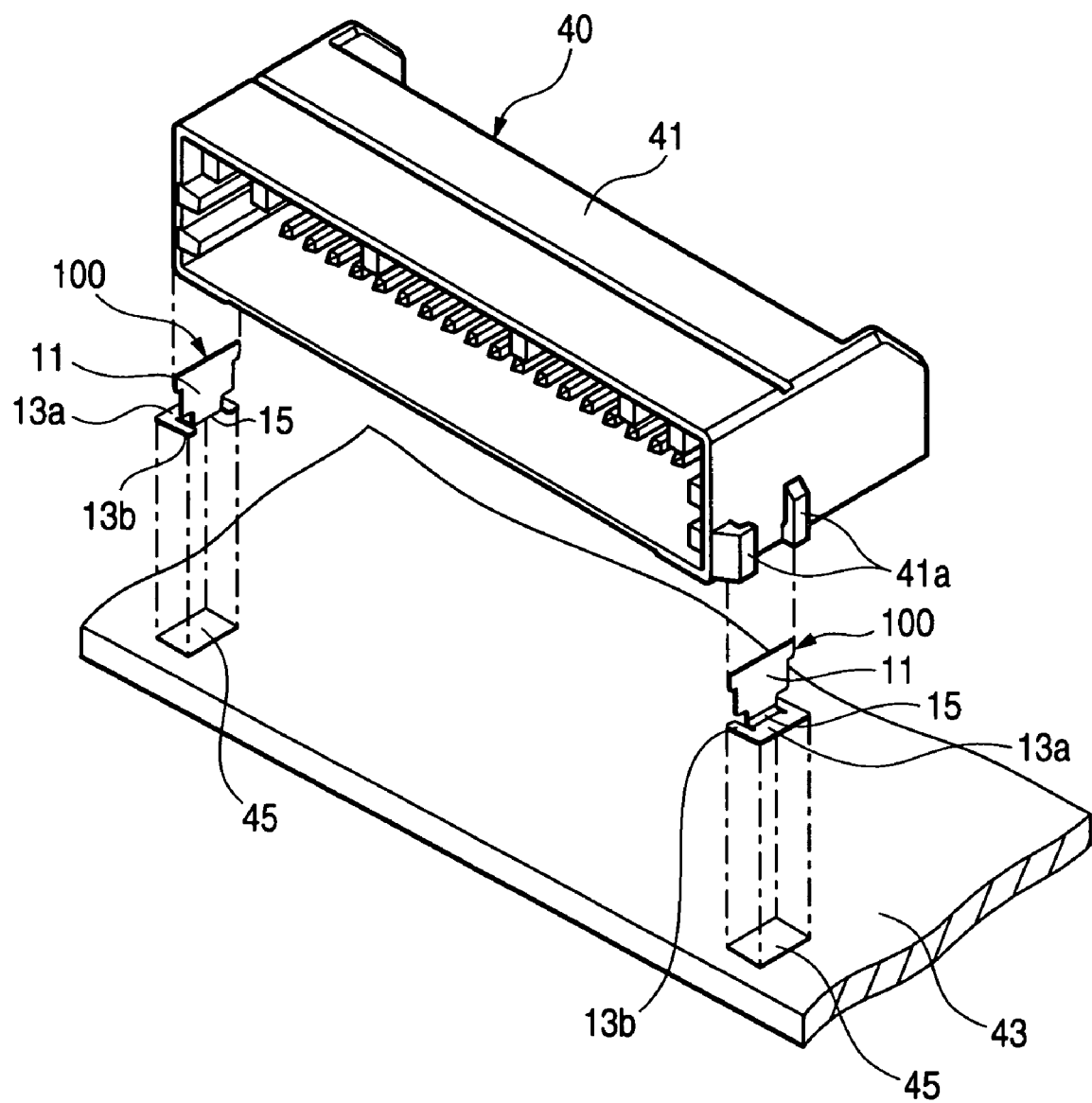
FIG. 2 is an exploded, perspective view explanatory of the manner of fixing a connector to a wiring board by the use of the metal fixing members of FIG. 1.
Figure 3:
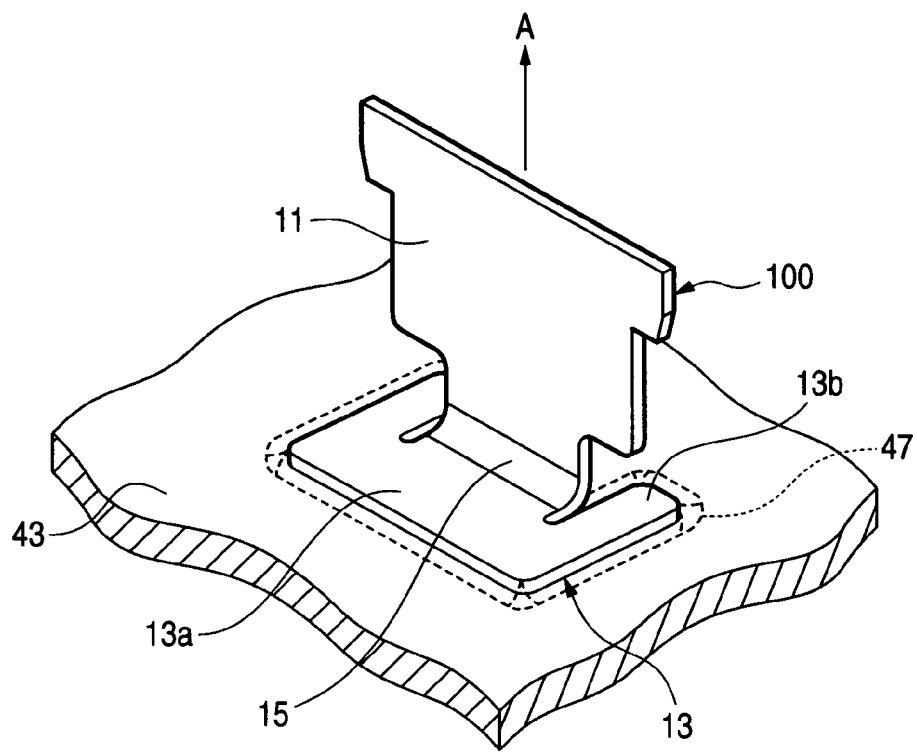
FIG. 3 is a perspective view of an important portion, showing a condition in which the metal fixing member of FIG. 1 is fixedly secured to the wiring board by soldering.

FIG. 1 is a perspective view of the first embodiment of a metal fixing member of the invention, FIG. 2 is an exploded, perspective view explanatory of the manner of fixing a connector to a wiring board by the use of the metal fixing members of FIG. 1, and FIG. 3 is a perspective view of an important portion, showing a condition in which the metal fixing member of FIG. 1 is fixedly secured to the wiring board by soldering.

As shown in FIGS. 1 and 2, the metal fixing member 100 of this embodiment is formed by pressing a single metal sheet into a predetermined shape, and this metal fixing member 100 includes a board fixing portion 13 for being fixed to a board surface of the wiring board 43, and a housing mounting portion 11 which is disposed in upstanding relation to the board fixing portion 13, and is adapted to be mounted on an outer surface of a connector housing 41 of the connector 40, and a bent interconnecting portion 15 interconnecting the board fixing portion 13 and the housing mounting portion 11.

The board fixing portion 13 is in the form of a flat plate of a generally U-shape, and the interconnecting portion 15 is disposed within the board fixing portion 13, and is formed on and extends from this board fixing portion 13 in such a manner that the interconnection portion 15 is bent at an angle of about 90 degrees relative to the board fixing portion 13. The housing mounting portion 11 extends from the interconnecting portion 15, and this housing mounting portion 11 is generally equal in width to the board fixing portion 13, and is in the form of a flat plate of a generally rectangular shape.

That portion 13a of the generally U-shaped board fixing portion 13, connected to the interconnecting portion 15, extends forwardly in a direction of a thickness of the housing mounting portion 11, and serves as a first fixing portion (13a). The interconnecting portion 15 is connected to a generally widthwise-central portion of one end edge of the first fixing portion 13a, and second fixing portions 13b are formed respectively on widthwise-opposite side portions of the one end edge of the first fixing portion 13a, and extend rearwardly beyond the interconnecting portion 15 in the direction of the thickness of the housing mounting portion 11.

The metal fixing member 100 of this configuration is formed in the following manner.

A pair of generally L-shaped notch grooves 17 are formed respectively in widthwise-opposite side portions of a strip-like metal sheet at a generally lengthwise-central portion thereof in such a manner that the two notch grooves 17 first extend respectively from the widthwise-opposite side edges of the metal sheet toward each other, and then extend longitudinally toward one end edge of the metal sheet.

That portion of the metal sheet, lying between the longitudinally-extending portions of the two notch grooves 17, serves as the interconnecting portion 15. That portion of the metal sheet, extending longitudinally from the interconnecting portion 15 toward the one end edge of the metal sheet, serves as the board fixing portion 13, while that portion of the metal sheet, extending longitudinally from the interconnecting portion 15 toward the other end edge of the metal sheet, serves as the housing mounting portion 11.

The interconnecting portion 15 is bent at an angle of about 90 degrees at a region disposed in the vicinity of front ends (disposed close to the one end edge of the metal sheet) of the longitudinally-extending portions of the two notch grooves 17. As a result, the housing mounting portion 11 is disposed in upstanding relation to the board fixing portion 13, and the first fixing portion 13a of the board fixing portion 13 extends forwardly of the housing mounting portion 11 in the direction of the thickness of the housing mounting portion 11, and the second fixing portions 13b extend rearwardly of the housing mounting portion 11 in the direction of the thickness thereof, with the interconnecting portion 15 disposed between the first and second fixing portions 13a and 13b.

Next, a method of fixing the connector 40 to the wiring board 43 by the use of the metal fixing members 100 will be described with reference to FIGS. 2 and 3.

As shown in FIGS. 2 and 3, the connector is fixed to the wiring board 43 by the pair of metal fixing members 100. More specifically, the housing mounting portions 11 of the pair of metal fixing members 100 are retainingly engaged respectively with fixing member mounting portions 41a formed respectively on opposite end surfaces of the connector housing 41, and therefore are mounted respectively on the opposite end surfaces of the connector housing 41. Then, the board fixing portions 13 of the two metal fixing members 100 are laid respectively on lands 45 (each made of a metallic foil) formed on the wiring board 43, and are soldered respectively to the lands 45 by solder layers 47 each interposed between the corresponding board fixing portion 13 and land 45

As shown in FIG. 3, the board fixing portion 13 includes the first fixing portion 13a extending forwardly of the housing mounting portion 11 in the direction of the thickness thereof, and the second fixing portions 13b extending rearwardly in the direction of the thickness of the housing mounting portion 11, with the interconnecting portion 15 disposed between the first and second fixing portions 13a and 13b. Even when an external force, tending to separate or tear the board fixing portion 13 from the wiring board 43, acts on the board fixing portion 13 (in a direction of arrow A in FIG. 3) via the housing mounting portion 11 and the interconnecting portion 15 of the metal fixing member 100, this external force is borne or supported in a distributed manner by the first and second fixing portions 13a and 13b extending respectively forwardly and rearwardly of the housing mounting portion 11 in the direction of the thickness thereof, with the interconnecting portion 15 disposed between the first and second fixing portions 13a and 13b. Therefore, the degree of concentration of stresses on the solder 47 interposed between that region of the board fixing portion 13, disposed adjacent to the interconnecting portion 15, and the land 45 is reduced.

Even if breakage should develop in the solder 47 interposed between the region of the board fixing portion 13, disposed adjacent to the interconnecting portion 15, and the land 45, this breakage proceeds toward the distal end edge of the first fixing portion 13a and also toward the distal end edges of the second fixing portions 13b. Therefore, the breakage, proceeding toward the distal end of the first fixing portion 13a, is suppressed by the second fixing portions 13b, and the breakage, proceeding toward the distal end edges of the second fixing portions 13b, is suppressed by the first fixing portion 13a. Namely, the proceeding of the breakage is suppressed by the mutual actions of the first and second fixing portions 13a and 13b. Therefore, the force of fixing of the metal fixing member 100 to the wiring board 43 can be enhanced, and therefore the metal fixing member 100 can be formed into a more compact design as compared with the related metal fixing member, while maintaining the sufficient fixing force, so that the space-saving design can be achieved.

In the metal fixing member 100 of this embodiment, the second fixing portions 13b extend respectively from the widthwise-opposite side portions of the one end edge of the first fixing portion 13a, and this metal fixing member can be easily processed in such a manner that the bottom surface of the first fixing portion 13a and the bottom surfaces of the second fixing portions 13b are disposed in a common plane. Therefore, the board fixing portion 13 can be fixedly secured to the land 45 of the wiring board 43 uniformly over the entire area thereof.

Second Embodiment

Next, the second embodiment of a metal fixing member of the invention will be described with reference to FIGS. 4 and 5. Those portions, corresponding to those of the metal fixing member 100 of the first embodiment, will be designated by corresponding reference numerals, respectively, and explanation thereof will be simplified.

Figure 4:
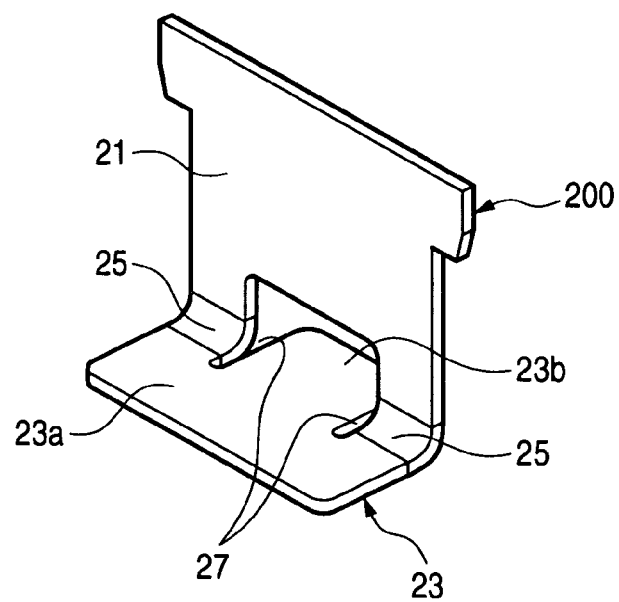
FIG. 4 is a perspective view of a second embodiment of a metal fixing member of the invention.
Figure 5:
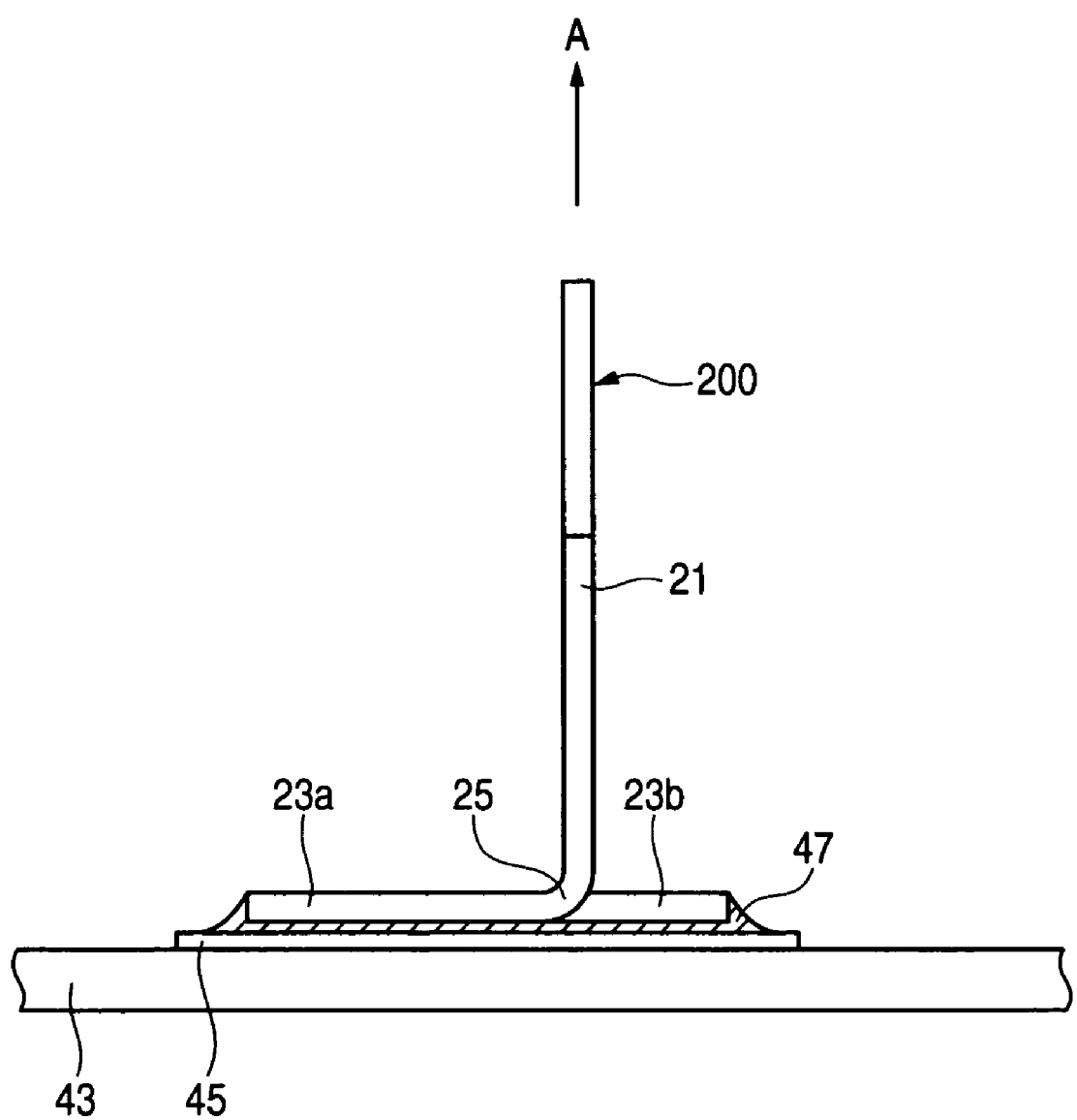
FIG. 5 is a side-elevational view, showing a condition in which the metal fixing member of FIG. 4 is fixedly secured to a wiring board by soldering.

FIG. 4 is a perspective view of the second embodiment of the metal fixing member of the invention, and FIG. 5 is a side-elevational view, showing a condition in which the metal fixing member of FIG. 4 is fixedly secured to a wiring board by soldering.

As shown in FIGS. 4 and 5, the metal fixing member 200 of this embodiment is formed by pressing a single metal sheet into a predetermined shape, and this metal fixing member includes a board fixing portion 23, a housing mounting portion 21, and interconnecting portions 25.

The board fixing portion 23 is in the form of a flat plate of a generally T-shape, and the pair of interconnecting portions 25 are formed on and extend respectively from widthwise-opposite side portions of one end edge of this board fixing portion 23 in such a manner that the interconnection portions 25 are bent at an angle of about 90 degrees relative to the board fixing portion 23. The housing mounting portion 21 extends from the pair of interconnecting portions 25, and this housing mounting portion 21 is generally equal in width to the board fixing portion 23, and is in the form of a flat plate of a generally rectangular shape.

That portion 23a of the generally T-shaped board fixing portion 23, connected to the interconnecting portions 25, extends forwardly of the housing mounting portion 21 in a direction of a thickness of the housing mounting portion 21, and serves as a first fixing portion (23a). That portion 23b of the board fixing portion 23, disposed between the pair of interconnecting portions 25, extends from a widthwise-central portion of the first fixing portion 23a beyond the interconnecting portions 25, and extends rearwardly of the housing mounting portion 21 in the direction of the thickness of the housing mounting portion 21, and serves as a second fixing portion (23b).

The metal fixing member 200 of this configuration is formed in the following manner.

A notch groove 27 of a generally U-shape is formed in a widthwise-central portion of a strip-like metal sheet at a generally lengthwise-central portion thereof in such a manner that the U-shape is open toward one end edge of the metal sheet in a longitudinal direction.

Those portions of the metal sheet, disposed respectively on the opposite sides of the generally U-shaped notch groove 27 in the widthwise direction, serve as the pair of interconnecting portions 25, respectively. That portion of the metal sheet, extending longitudinally from the interconnecting portions 25 toward the one end edge of the metal sheet, serves as the board fixing portion 23, while that portion of the metal sheet, extending longitudinally from the interconnecting portions 25 toward the other end edge of the metal sheet, serves as the housing mounting portion 21.

Then, the interconnecting portions 25 are bent at an angle of about 90 degrees at a region disposed in the vicinity of front ends of the longitudinally-extending portions of the notch groove 27. As a result, the housing mounting portion 21 is disposed in upstanding relation to the board fixing portion 23, and the first fixing portion 23a of the board fixing portion 23 extends forwardly of the housing mounting portion 21 in the direction of the thickness of the housing mounting portion 21, and the second fixing portion 23b extends rearwardly of the housing mounting portion 21 in the direction of the thickness thereof, with the interconnecting portions 25 disposed generally between the first and second fixing portions 23a and 23b.

The operation and effects of the metal fixing member 200 are similar to those of the metal fixing member 100 of the first embodiment, and therefore explanation thereof is omitted here.

Third Embodiment

Next, the third embodiment of a metal fixing member of the invention will be described with reference to FIGS. 6 to 8. Those portions, corresponding to those of the metal fixing member 100 of the first embodiment and the metal fixing member 200 of the second embodiment, will be designated by corresponding reference numerals, respectively, and explanation thereof will be simplified.

Figure 6:
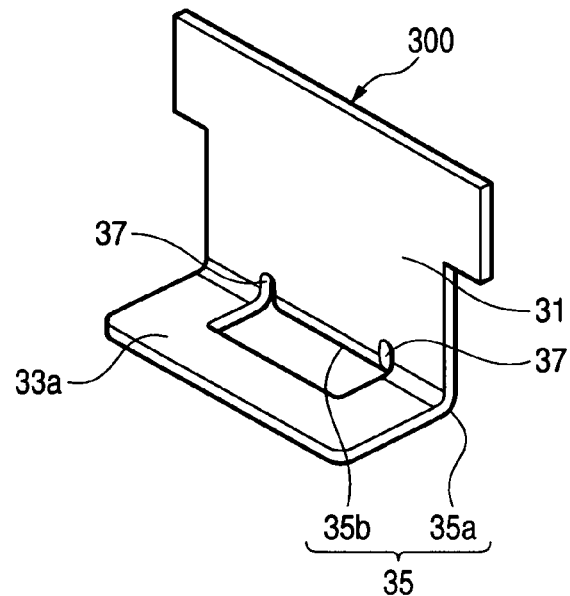
FIG. 6 is a perspective view of a third embodiment of a metal fixing member of the invention.
Figure 7:
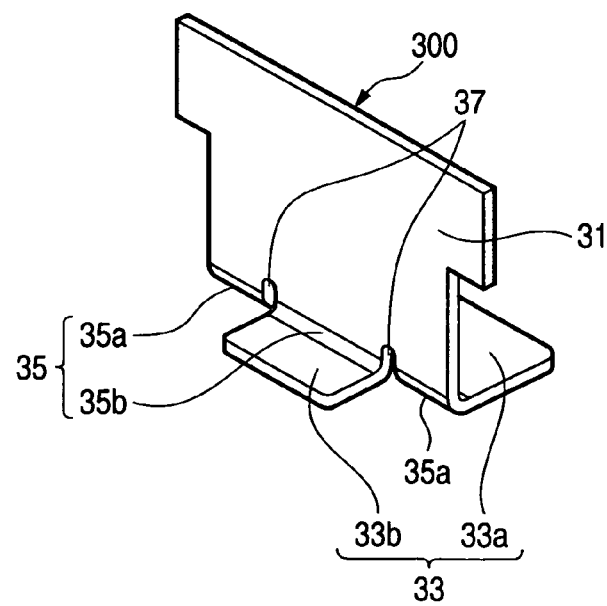
FIG. 7 is a perspective view of the metal fixing member of FIG. 6 as seen from a different angle.
Figure 8:
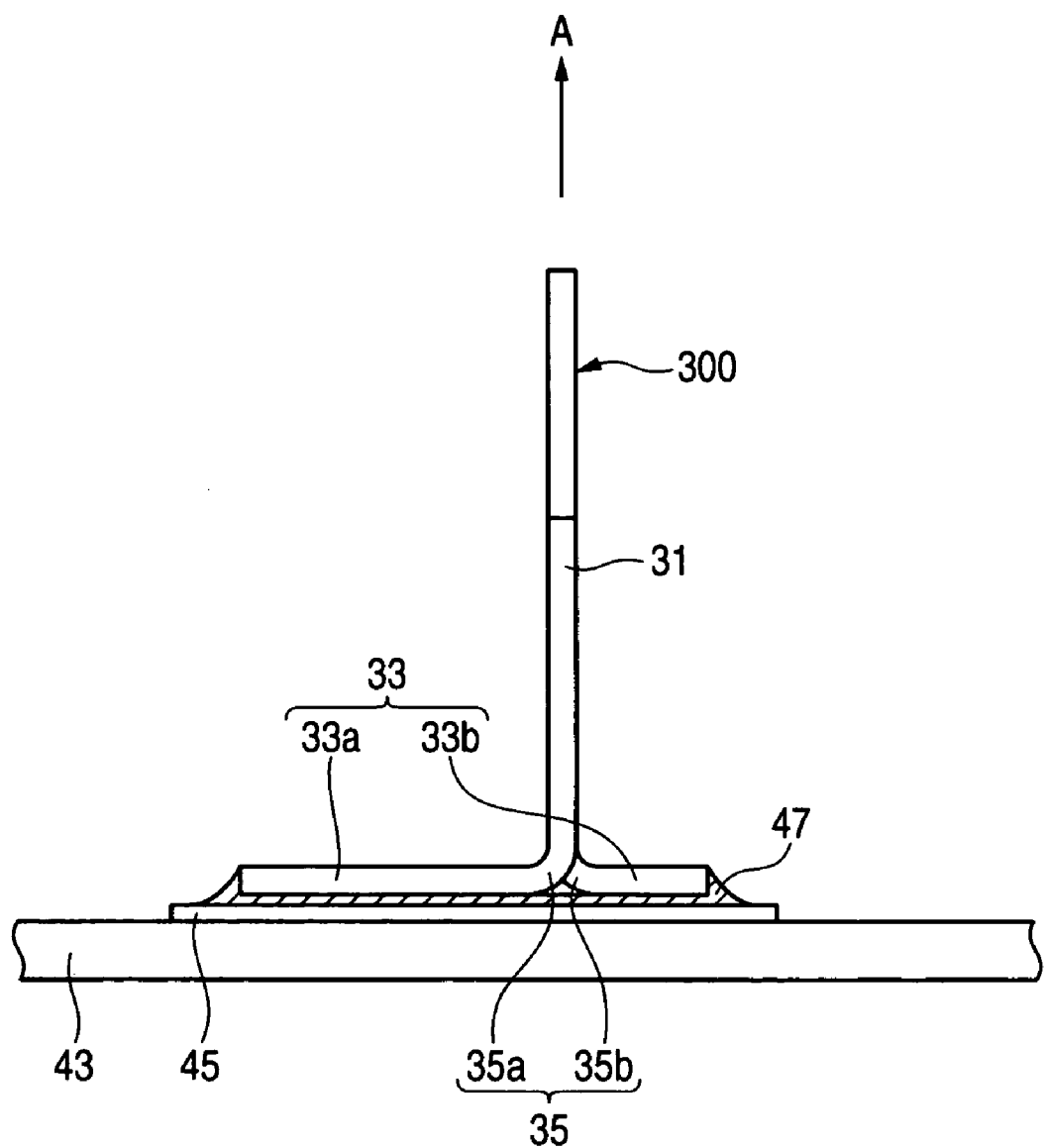
FIG. 8 is a side-elevational view, showing a condition in which the metal fixing member of FIGS. 6 and 7 is fixedly secured to a wiring board by soldering.
Figure 9:
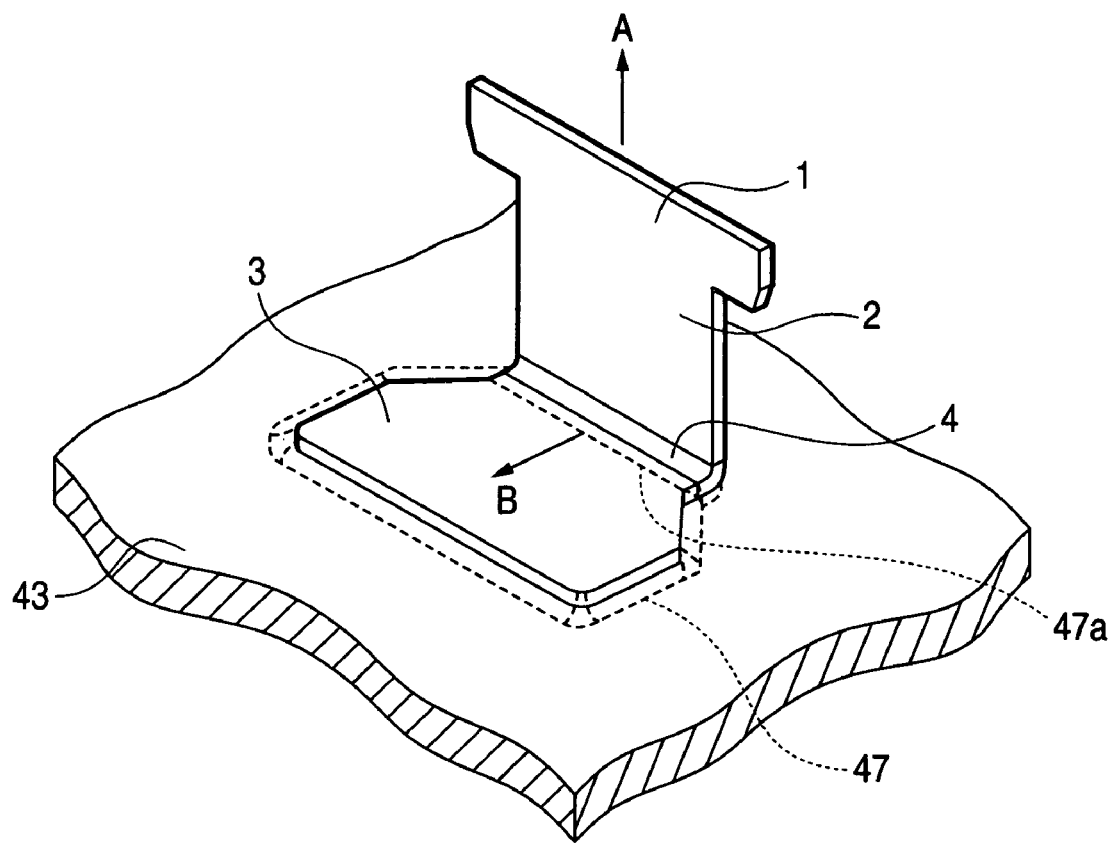
FIG. 9 is a perspective view of a related metal fixing member soldered to a wiring board.

FIG. 6 is a perspective view of the third embodiment of the metal fixing member of the invention, and FIG. 7 is a perspective view of the metal fixing member of FIG. 6 as seen from a different angle, and FIG. 8 is a side-elevational view, showing a condition in which the metal fixing member of FIGS. 6 and 7 is fixedly secured to a wiring board by soldering.

As shown in FIGS. 6 to 8, the metal fixing member 300 of the third embodiment is formed by pressing a single metal sheet into a predetermined shape, and this metal fixing member includes a board fixing portion 33, a housing mounting portion 31, and interconnecting portions 35.

The board fixing portion 33 includes a first fixing portion 33a extending forwardly of the housing mounting portion 31 in a direction of a thickness of the housing mounting portion 31, and a second fixing portion 33b extending rearwardly of the housing mounting portion 31 in the direction of the thickness thereof, with the interconnecting portions 35 disposed between the first and second fixing portions 33a and 33b. The first fixing portion 33a is connected to the housing mounting portion 31 via the pair of first interconnecting portions 35a formed respectively on widthwise-opposite side portions of the first fixing portion 33a, the two first interconnecting portions 35a being bent in the same direction at an angle of about 90 degrees. The second fixing portion 33b is connected to the housing mounting portion 31 via the second interconnecting portion 35b which is disposed between the pair of first interconnecting portions 35a, and is bent in symmetrical relation to the first interconnecting portions 35a.

The metal fixing member 300 of this configuration is formed in the following manner.

A notch groove 37 of a generally U-shape is formed in a widthwise-central portion of a generally-rectangular metal sheet at a generally lengthwise-central portion thereof in such a manner that the U-shape is open toward one end edge of the metal sheet in a longitudinal direction.

Those portions of the metal sheet, which are disposed respectively on the opposite sides of the generally U-shaped notch groove 37 in the widthwise direction, and are disposed near to the open side of the U-shape of the notch groove 37, serve as the pair of first interconnecting portions 35a, respectively, while that portion of the metal sheet, which is disposed inside the U-shaped notch groove 37, and is disposed near to the open side of the U-shape, serves as the second interconnecting portion 35b. That portion of the metal sheet, extending longitudinally from the first and second interconnecting portions 35a and 35b toward the one end edge of the metal sheet, serves as the housing mounting portion 31, while that portion of the metal sheet, extending longitudinally from the interconnecting portions 35a toward the other end edge of the metal sheet, serves as the board fixing portion 33.

The first interconnecting portions 35a and the second interconnecting portion 35b are bent at an angle of about 90 degrees in symmetrical relation to each other. As a result, the housing mounting portion 31 is disposed in upstanding relation to the board fixing portion 33, and the first fixing portion 33a of the board fixing portion 33 extends forwardly of the housing mounting portion 31 in the direction of the thickness of the housing mounting portion 31, while the second fixing portion 33b extends rearwardly of the housing mounting portion 31 in the direction of the thickness thereof, and bottom surfaces of the first and second fixing portions 33a and 33b are disposed in a common plane.

In the metal fixing member 300 of this embodiment, the first fixing portion 33a is connected to the housing mounting portion 31 via the bent first interconnecting portions 35a, while the second fixing portion 33b is connected to the housing mounting portion 31 via the second interconnecting portion 35b which is bent in symmetrical relation to the first interconnecting portions 35a. Therefore, the interconnecting portions 35 can be formed over the substantially entire width of the metal sheet forming the metal fixing member 300. With this construction, when an external force, tending to separate or tear the board fixing portion 33 from the wiring board 43, acts on the housing mounting portion 31, the degree of concentration of stresses on solder 47 (on which the stresses are liable to concentrate) interposed between that region of the board fixing portion 33, disposed adjacent to the interconnecting portions 35, and a land 45 can be reduced. The other operation and effects are similar to those of the metal fixing members 100 and 200 of the first and second embodiments, and therefore explanation thereof is omitted here.

The present invention is not limited to the above embodiments, and suitable modifications, improvements and so on can be made. In each of the above embodiments, the material, shape, dimensions, numerical value, form, number, disposition, etc., of each of the constituent elements are arbitrary, and are not limited in so far as the invention can be achieved.

The present application is based on Japan Patent Application No. 2004-377016 filed on Dec. 27, 2004, the contents of which are incorporated herein for reference.

What is claimed is:

1. A fixing configuration, comprising:
a connector which has a terminal receiving portion for receiving a terminal; and
a metal fixing member for fixing the connector to a wiring board, comprising:
a board fixing portion that is adapted to be secured to the wiring board;
a housing mounting portion that is disposed in upstanding relation to the board fixing portion, and is adapted to be mounted on the connector; and
an interconnecting portion that is bended and that interconnects the board fixing portion and the housing mounting portion,
wherein the housing mounting portion has a retaining portion for retaining a housing of the connector,
wherein the board fixing portion includes a first fixing portion and a second fixing portion that are arranged in symmetrical relation with respect to the interconnecting portion;
wherein the first fixing portion extends in a first direction along a thickness direction of the housing mounting portion;
wherein the second fixing portion extends from the first fixing portion in a second direction opposed to the first direction,
wherein the metal fixing member is formed entirely of a single metal sheet,
wherein the first fixing portion and the second fixing portion are arranged in a same plane,
wherein the housing mounting portion is extended from the board fixing portion through the interconnecting portion substantially perpendicular to the same plane,
wherein a pair of slits extending in the first direction are formed in the board fixing portion so as to separate the interconnecting portion from the first and second fixing portion; and
wherein a terminal receiving direction of the terminal receiving portion of the connector is perpendicular to the first direction.

2. The fixing configuration according to claim 1, wherein the first fixing portion extends from the interconnecting portion; and
wherein the second fixing portion extends from the first fixing portion.

3. The fixing configuration according to claim 2, wherein the interconnecting portion includes two interconnecting portions; and
wherein the second fixing portion is arranged between the two interconnecting portions, and is separated from the two interconnecting portions.

4. The fixing configuration according to claim 2, wherein the second fixing portion includes two second fixing portions; and
wherein the interconnecting portion is arranged between the two second fixing portions, and is separated from the two second fixing portions.

5. The fixing configuration according to claim 1, wherein the interconnecting portion includes a first interconnecting portion and a second interconnecting portion that is bent in symmetrical relation to the first interconnecting portion;
wherein the first fixing portion is connected to the housing mounting portion through the first interconnecting portion; and
wherein the second fixing portion is connected to the housing mounting portion through the second interconnecting portion.

6. A connector provided with the fixing configuration as set forth in claim 1 that is mounted on an outer surface of a connector housing thereof.

7. A connector provided with the fixing configuration as set forth in claim 2 that is mounted on an outer surface of a connector housing thereof.

8. A connector provided with the fixing configuration as set forth in claim 3 that is mounted on an outer surface of a connector housing thereof.

9. A metal fixing member for fixing a connector to a wiring board, comprising:
a board fixing portion that is adapted to be secured to the wiring board;

a housing mounting portion that is disposed in upstanding relation to the board fixing portion, and is adapted to be mounted on the connector; and an interconnecting portion that is bended and that interconnects the board fixing portion and the housing mounting portion, wherein the housing mounting portion has a retaining portion for retaining a housing of the connector, wherein the board fixing portion includes a first fixing portion and a second fixing portion that are arranged in symmetrical relation with respect to the interconnecting portion;

wherein the first fixing portion extends in a first direction along a thickness direction of the housing mounting portion;

wherein the second fixing portion extends from the first fixing portion in a second direction opposed to the first direction, wherein the metal fixing member is formed entirely of a single metal sheet, wherein the first fixing portion and the second fixing portion are arranged in a same plane, wherein the housing mounting portion is extended from the board fixing portion through the interconnecting portion substantially perpendicular to the same plane, wherein if an acting force acting on the board fixing portion so as to tear the board fixing portion from the wiring board is generated by an external force applied to the housing mounting portion in an upstanding direction of the housing mounting portion through at least the retaining portion, the acting force is dispersed by the first fixing portion and the second fixing portion, wherein the first fixing portion extends from the interconnecting portion, wherein the second fixing portion extends from the first fixing portion, wherein the interconnecting portion includes two interconnecting portions, wherein the second fixing portion is arranged between the two interconnecting portions, and is separated from the two interconnecting portions.

10. The metal fixing member according to claim 9, wherein the second fixing portion includes two second fixing portions; and wherein the interconnecting portion is arranged between the two second fixing portions, and is separated from the two second fixing portions.

11. A metal fixing member for fixing a connector to a wiring board, comprising:

a board fixing portion that is adapted to be secured to the wiring board;

a housing mounting portion that is disposed in upstanding relation to the board fixing portion, and is adapted to be mounted on the connector; and an interconnecting portion that is bended and that interconnects the board fixing portion and the housing mounting portion, wherein the board fixing portion includes a first fixing portion and a second fixing portion that are arranged in symmetrical relation with respect to the interconnecting portion;

wherein the first fixing portion extends in a first direction along a thickness direction of the housing mounting portion;

wherein the second fixing portion extends from the first fixing portion in a second direction opposed to the first direction, wherein the metal fixing member is formed entirely of a single metal sheet, wherein the first fixing portion and the second fixing portion are arranged in a same plane, wherein the housing mounting portion is extended from the board fixing portion through the interconnecting portion substantially perpendicular to the same plane, wherein the interconnecting portion includes a first interconnecting portion and a second interconnecting portion that is bent in symmetrical relation to the first interconnecting portion;

wherein the first fixing portion is connected to the housing mounting portion through the first interconnecting portion; and wherein the second fixing portion is connected to the housing mounting portion through the second interconnecting portion.

12. A connector provided with a metal fixing member as set forth in claim 9 that is mounted on an outer surface of a connector housing thereof.

* * * * *